United States Patent [19]

Maeguchi

[11] Patent Number: 4,564,583

[45] Date of Patent: Jan. 14, 1986

[54] METHOD FOR MANUFACTURING A SEMICONDUCTOR DEVICE

[75] Inventor: Kenji Maeguchi, Yokohama, Japan

[73] Assignee: Tokyo Shibaura Denki Kabushiki Kaisha, Kawasaki, Japan

[21] Appl. No.: 575,921

[22] Filed: Feb. 1, 1984

[30] Foreign Application Priority Data

Feb. 7, 1983 [JP] Japan ................................. 58-18533
Feb. 24, 1983 [JP] Japan ................................. 58-29709
Feb. 24, 1983 [JP] Japan ................................. 58-29724

[51] Int. Cl.⁴ .......................... G03C 5/00; H01L 21/00
[52] U.S. Cl. ..................................... 430/312; 430/314; 430/317; 430/318; 430/329; 430/330; 427/38; 148/187; 29/576 B
[58] Field of Search ............... 430/312, 313, 314, 318, 430/323, 325, 326, 311, 315, 317, 327, 329, 330; 427/38; 29/576 B; 148/187

[56] References Cited

U.S. PATENT DOCUMENTS 3,873,313 3/1975 Horst et al. ......................... 430/312
4,283,483 8/1981 Coane .................................. 430/296
4,394,437 7/1983 Bergendahl et al. ............... 430/312

FOREIGN PATENT DOCUMENTS 56-115547 9/1981 Japan ................................... 427/38

*Primary Examiner*—Mary F. Downey
*Assistant Examiner*—José G. Dees
*Attorney, Agent, or Firm*—Finnegan, Henderson, Farabow, Garrett & Dunner

[57] ABSTRACT

Disclosed is a method for manufacturing a semiconductor device which comprises a process for forming a positive-type resist film and a negative-type resist film on a semiconductor substrate, a process for exposing predetermined regions of both resist films to radiation, a process for developing the upper resist film to form a first resist pattern adapted to be used as a mask for ion-implantation, a process for developing the lower resist film to form a second resist pattern opposite to the first resist pattern after peeling off the first resist pattern, and a process for treatment the semiconductor substrate using the second resist pattern as a mask.

15 Claims, 30 Drawing Figures

METHOD FOR MANUFACTURING A SEMICONDUCTOR DEVICE

BACKGROUND OF THE INVENTION

The present invention relates to a method of manufacturing a semiconductor device, and more specifically to a method for manufacturing a semi-conductor device using complementary resist patterns in self-alignment.

In the manufacture of a semiconductor device, e.g., an MOS transistor, resist patterns are used which are complementary to each other or in an inverse relation. For example, the complementary resist patterns are used in a process for forming an element isolation region (field oxide film) and a field inversion preventing layer thereunder.

Conventionally, the MOS transistor is manufactured by the following method including the aforesaid process.

First, a thin oxide film 2 is formed on a p-type semiconductor substrate 1, and a resist layer 3 is then applied over the whole surface of the oxide film 2, as shown in FIG. 1A. Then, those portions of the resist layer 3 which correspond to field regions are selectively removed by the photoengraving process (PEP) to form a resist pattern 4, as shown in FIG. 1B. Thereafter, a p-type impurity, e.g., boron, is ion-implanted in the surface of the semiconductor substrate 1 by the use of the resist pattern 4 as a mask, forming a p-type field inversion preventing layer 5.

Subsequently, the resist pattern 4 is peeled off, the thin oxide film 2 thereunder is removed, and then a thick oxide film 6 is formed on the whole surface of the resultant structure by heat oxidation, as shown in FIG. 1C. Then, a resist pattern 7 is formed by the PEP on those portions of the oxide film 6 which correspond to the field regions. Thereafter, the thick oxide film 6 is selectively etched by using the resist pattern 7 as a mask to form a field oxide film 8, as shown in FIG. 1D.

After the resist pattern 7 is peeled off, a thin oxide film 9 is formed on the exposed surface of the semiconductor substrate 1 by heat treatment, and a polycrystalline silicon (polysilicon) layer 10 is formed on the whole surface of the resultant structure, as shown in FIG. 1E. Thereafter, the polysilicon layer 10 is patterned to form a gate electrode 11, and then the thin oxide film 9 is selectively etched by using the gate electrode 11 as a mask to form a gate oxide film 12, as shown in FIG. 1F. Further, an n-type impurity, e.g., arsenic, is ion-implanted in the surface of the semiconductor substrate 1 by the use of the gate electrode 11 as a mask, and $n^+$-type source and drain regions 13 and 14 are formed in the surface of the semiconductor substrate 1. Then, an interlayer insulation film 15 is deposited on the whole surface of the structure, and contact holes 16 are formed in those portions of the insulation film 15 which correspond to parts of the source and drain regions 13 and 14. Thereafter, wirings 17 and 18 connecting the source and drain regions 13 and 14 through the contact holes 16 are formed on the insulation film 15, as shown in FIG. 1G. Thus, an MOS transistor is completed.

According to the aforementioned manufacturing method, however, the field inversion preventing layer 5 and the field oxide film 8 are formed by using the resist patterns 4 and 7, as the masks, that are formed by different PEP's and are inevitably subject to misalignment. Therefore, it is hard to form the field inversion preventing layer 5 and the field oxide film 8 in self-alignment.

As a result, the field inversion preventing layer 5 extends to the island region (element region) of the semiconductor substrate 1 which is isolated by the field oxide film 8, as indicated by a hatched section 19 in FIG. 2. If the element region is fine, there will be formed narrow channels, which cause fluctuations of threshold voltage and the like. The fluctuations will then deteriorate the element characteristics of the MOS transistor obtained. Moreover, the field inversion preventing layer 5 is not formed right below the transistor ends indicated by symbol A, permitting production of a parasitic MOS transistor.

The use of the separately formed resist patterns 4 and 7 requires two exposure processes which lower the efficiency of the production of the MOS transistor.

SUMMARY OF THE INVENTION

An object of the present invention is to provide a method for manufacturing a semiconductor device using first and second resist patterns in an inverse relation and in self-alignment as masks.

Another object of the invention is to provide a method for manufacturing a semiconductor device capable of forming first and second resist patterns by one exposure process, thereby improving the efficiency of the production of the semiconductor device.

Still another object of the invention is to provide a method for manufacturing a semiconductor device, in which a first resist pattern is used as a mask for ion-implantation of an impurity of the same conductivity type as that of a semiconductor substrate, and a second resist pattern is used as an etching mask for a thick insulation film on the semiconductor substrate, whereby a field insulation film and a field inversion preventing layer are formed in self-alignment, so that the production of narrow channels is prevented and the element characteristics of the semiconductor device is improved.

A further object of the invention is to provide a method for manufacturing a semiconductor device, in which a first resist pattern is used as a mask for ion-implantation of an impurity in a semiconductor substrate, and a second resist pattern is used as an etching mask for a conductive material layer on the semiconductor substrate and also as a mask for ion-implantation of an impurity of a conductivity type opposite to that of the semiconductor substrate, whereby the source and drain regions of the conductivity type opposite to that of the substrate and a channel region with controlled threshold voltage are formed in self-alignment in the surface of the substrate.

An additional object of the invention is to provide a method for manufacturing a semiconductor device, in which a first resist pattern is used as a mask for ion-implantation of an impurity of a conductivity type in a semiconductor substrate, and a second resist pattern is used as a mask for ion-implantation of an impurity of a conductivity type opposite to that of the aforesaid impurity in the semiconductor substrate, whereby tub regions of different conductivity types are formed in self-alignment in the surface of the semiconductor substrate.

According to the present invention, there is provided a method for manufacturing a semiconductor device, which comprises a process for forming a positive-type resist film and a negative-type resist film on a semiconductor substrate, a process for exposing predetermined regions of both resist films to radiation, a process for developing the upper resist film to form a first resist pattern adapted to be used as a mask for ion-implantation, a process for developing the lower resist film to form a second resist pattern opposite to the first resist pattern after peeling off the first resist pattern, and a process for treating the semiconductor substrate using the second resist pattern as a mask.

DETAILED DESCRIPTION OF THE PREFERRED EMBODIMENT

Examples of the present invention will now be described in detail with reference to the accompanying drawings.

EXAMPLE 1

Example 1 shows an application of the manufacture of an n-channel MOS transistor.

Figure 1A:
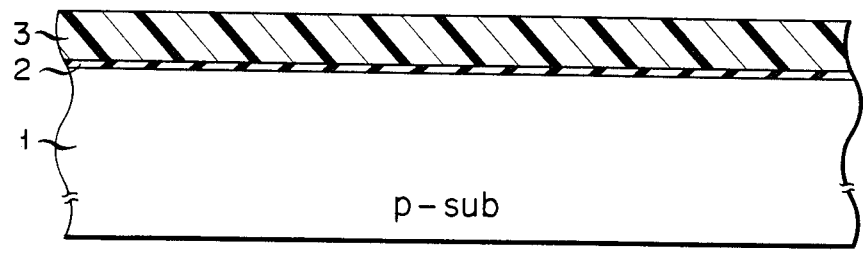
FIGS. 1A to 1G are sectional views illustrating processes for manufacturing a prior art MOS transistor.
Figure 1B:
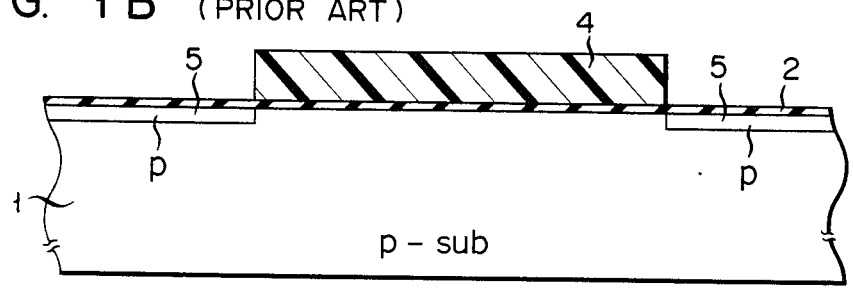
Figure 1C:
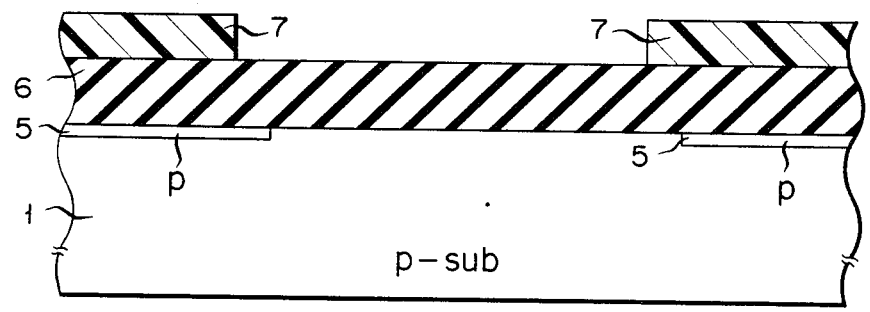
Figure 1D:
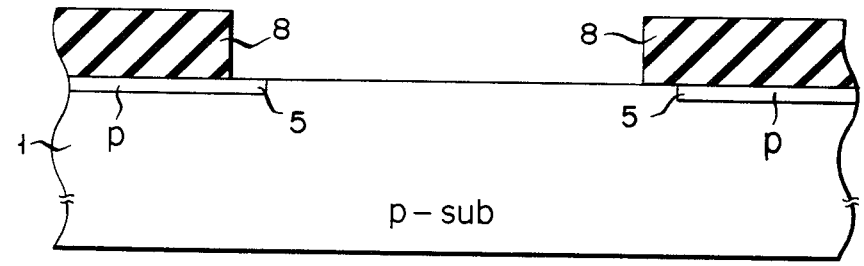
Figure 1E:
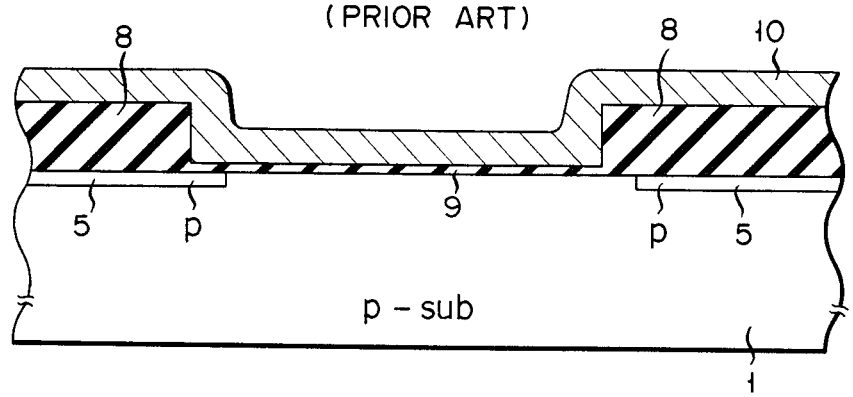
Figure 1F:
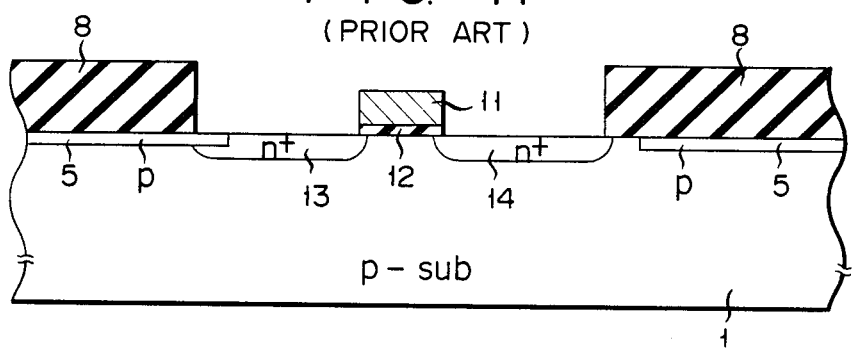
Figure 1G:
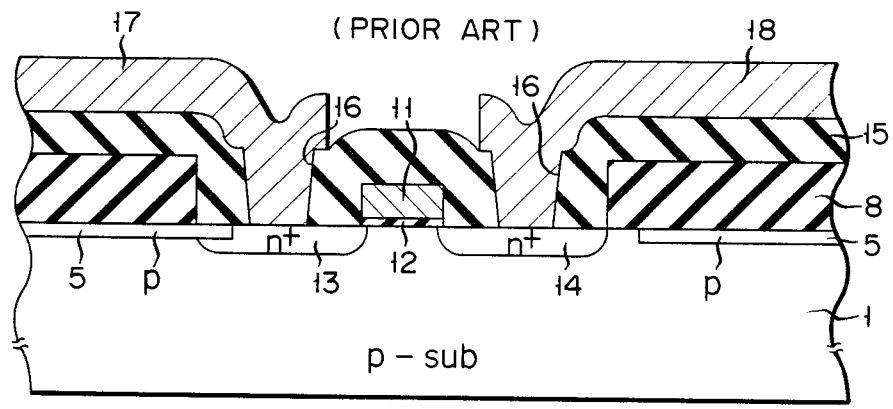
Figure 2:
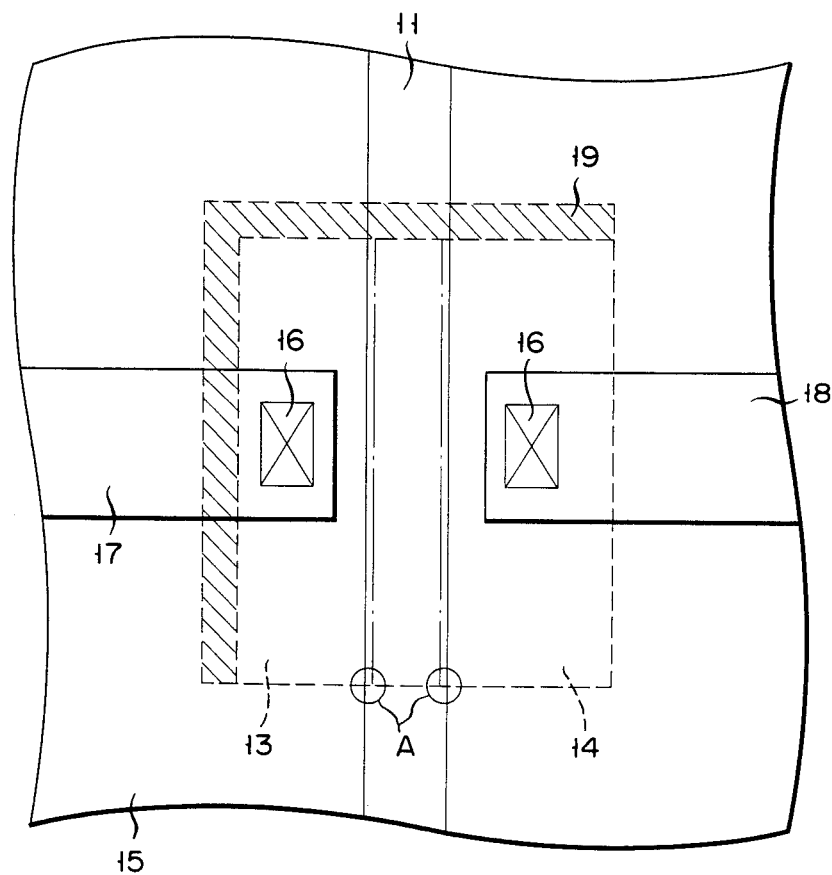
FIG. 2 is a plan view of the structure shown in FIG. 1G.
Figure 3A:
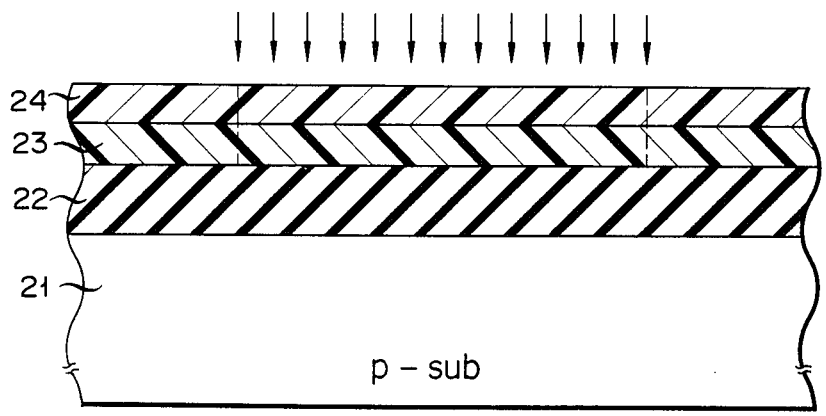
FIGS. 3A to 3G are sectional views illustrating processes for manufacturing an MOS transistor according to Example 1 of the present invention.

First, a p-type silicon substrate 21 was heat-oxidized to form an oxide film 22 of 8,000-Å thickness on the substrate 21. Next, a positive-type resist (OFPR-78 from Tokyo Oka Kogyo Co., Ltd.) and a negative-type resist (OMR-83 from Tokyo Oka Kogyo Co, Ltd.) were applied to the oxide film 22 to successively form positive- and negative-type resist films 23 and 24 each having a thickness of 5,000 Å, as shown in FIG. 3A. Then, ultraviolet rays were applied selectively for exposure of those parts of the negative-and positive-type resist films 24 and 23 which correspond to the regions for element formation. Thereupon, the negative-type resist film 24 exhibited a bridging effect, while the positive type-resist film 23 underwent a collapse.

Figure 3B:
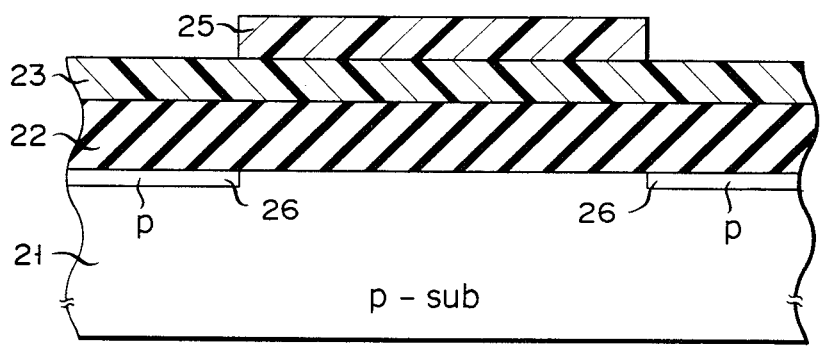

Then, the negative-type resist film 24 was developed by the use of a developing solution for negative-type resist to form a negative-type resist pattern 25 as a first resist pattern, as shown in FIG. 3B. Thereafter, a p-type impurity, e.g., boron, was ion-implanted in the surface of the substrate 21 with the negative-type resist pattern 25 as a mask, forming a p-type field inversion preventing layer 26.

Figure 3C:
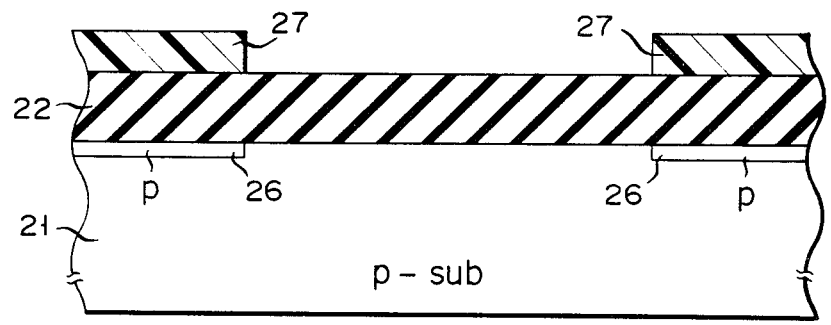
Figure 3D:
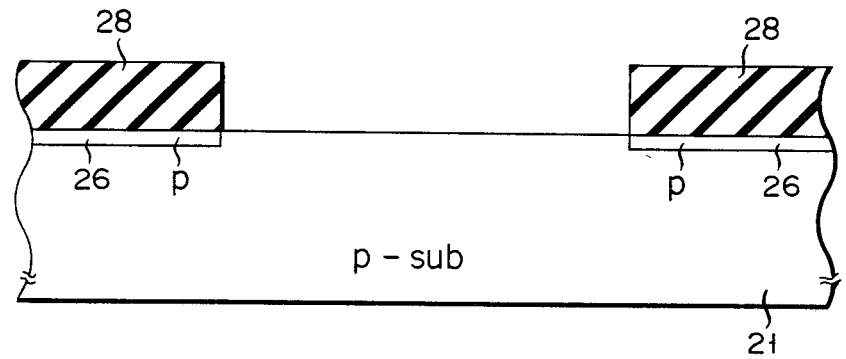

Subsequently, the negative-type resist pattern 25 was peeled off, and the positive-type resist film 23 was thereafter developed by the use of a developing solution for a positive-type resist to form a positive-type resist pattern (second resist pattern) 27 which is opposite to the negative-type resist pattern 25, as shown in FIG. 3C. Then, after the thick oxide film 22 was selectively etched by using the positive-type resist pattern 27 as a mask to form a field oxide film 28, the positive-type resist pattern 27 was peeled off, as shown in FIG. 3D.

Figure 3E:
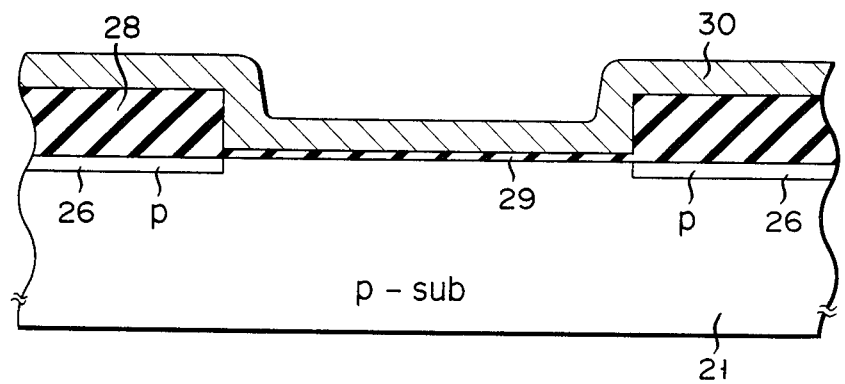
Figure 3F:
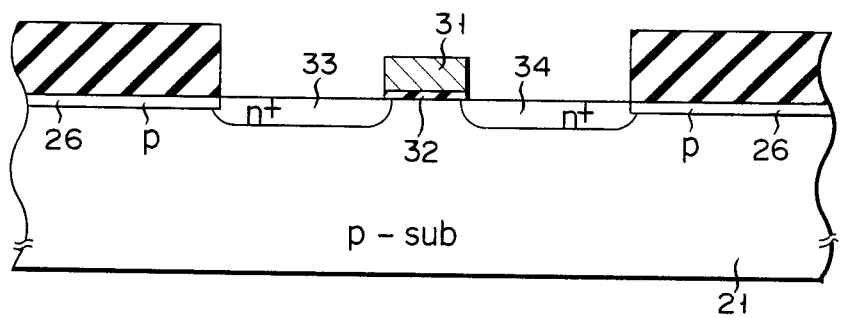

Subsequently, an oxide film 29 of 800-Å thickness was formed on the exposed surface of the substrate 21 by heat treatment, and a polysilicon layer 30 was formed over the whole surface of the resultant structure, as shown in FIG. 3E. Then, the polysilicon layer 30 was patterned to form a gate electrode 31, and the thin oxide film 29 was thereafter selectively etched by using the gate electrode 31 as a mask to form a gate oxide film 32, as shown in FIG. 3F. Thereafter, an n-type impurity, e.g., phosphorus, was ion-implanted in the exposed surface of the substrate 21 by using the gate electrode 31 as a mask, and n$^+$-type source and drain regions 33 and 34 were formed by heat treatment.

Figure 3G:
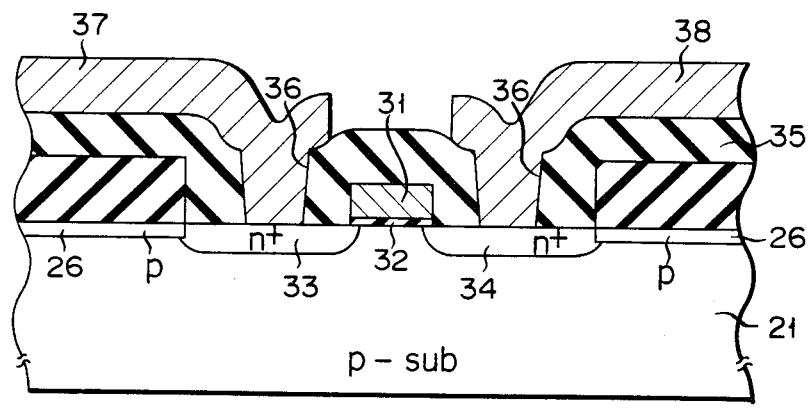
Figure 4:
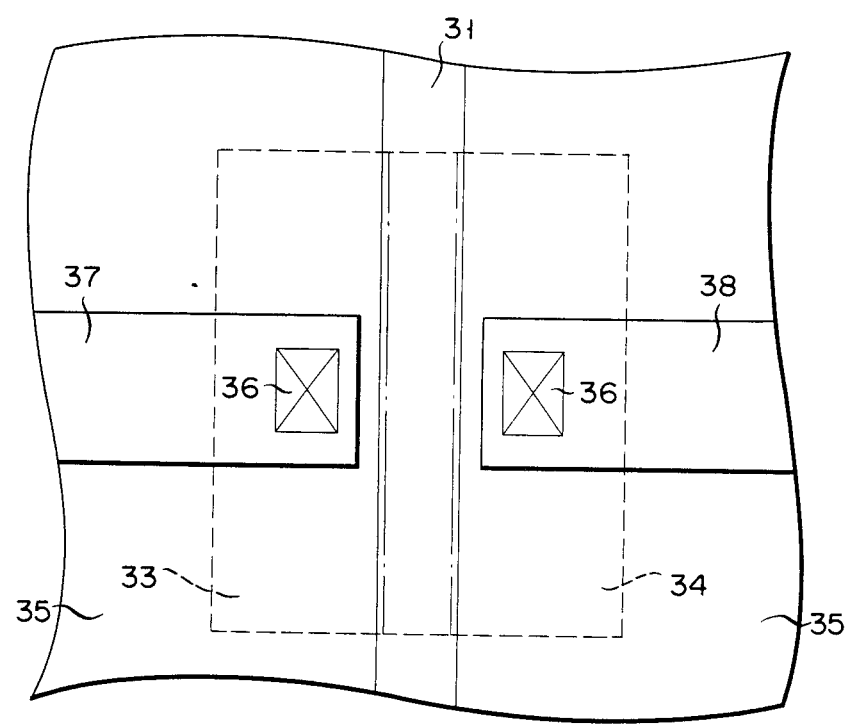
FIG. 4 is a plan view of the structure shown in FIG. 3G.

Then a SiO$_2$ film 35 was deposited on the whole surface of the resultant structure, and contact holes 36 were formed in those portions of the SiO$_2$ film 35 which correspond to the parts of the source and drain regions 33 and 34, as shown in FIGS. 3G and 4. Thereafter, aluminum wirings 37 and 38 connecting the source and drain regions 33 and 34 through the contact holes 36 were formed on the SiO$_2$ film 35. Thus, an MOS transistor was completed.

According to the method of Example 1, the negative-type resist pattern 25 and positive-type resist pattern 27 opposite to the negative type resist pattern 25 can be formed by one exposure and two developing treatments of the positive- and negative-type resist films 23 and 24 that are successively laid over the thick oxide film 22 on the substrate 21. Thus, the field inversion preventing layer 26 and the field oxide film 28 may be formed in self-alignment by using the resist patterns 25 and 27 as masks, as shown in FIGS. 3G and 4. Accordingly, the field inversion preventing layer 26 can be prevented from extending to the island region (element region) of the semiconductor substrate 21 isolated by the field oxide film 28. Moreover, although the island region is fine, it prevents production of the narrow channels attributed to the fluctuations of threshold voltage, thus providing a small MOS transistor with satisfactory element characteristics.

Also, the MOS transistor obtained in this manner may greatly be improved in productivity, since the negative- and positive-type resist patterns 25 and 27 can be formed by one exposure and two developing treatments.

EXAMPLE 2

Example 2 is applied to the manufacture of an n-channel MOS transistor.

Figure 5A:
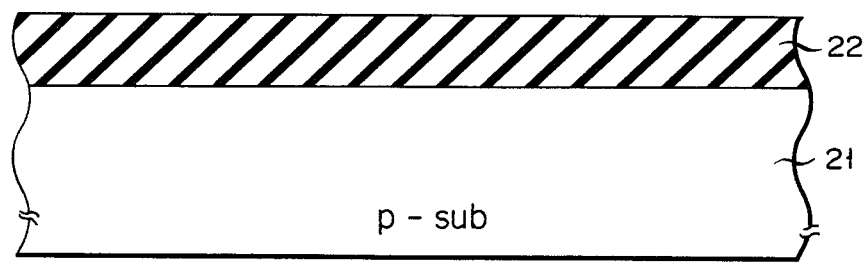
FIGS. 5A to 5F are sectional views illustrating processes for manufacturing an MOS transistor according to Example 2 of the invention.
Figure 5B:
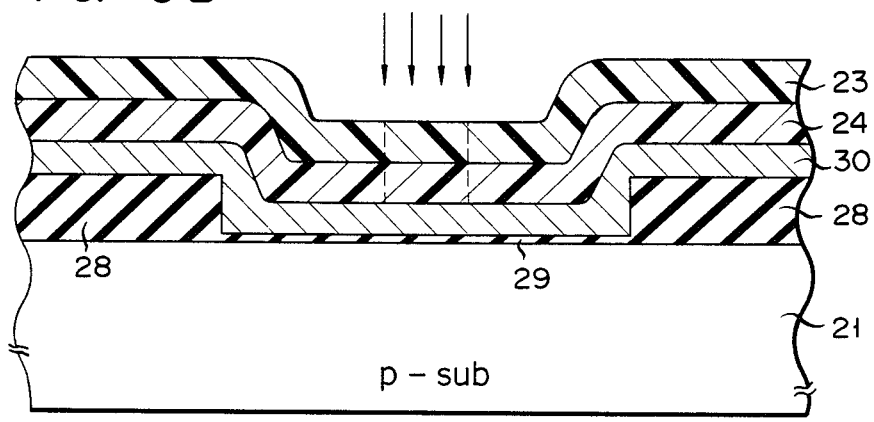

First, a p-type silicon substrate 21 was heat-oxidized to form an oxide film 22 of 8,000-Å thickness on the substrate 21, as shown in FIG. 5A. Thereafter, the oxide film 22 was patterned to form a field oxide film 28. A thin oxide film 29 was formed on the exposed surface of the substrate 21 by heat treatment, and then a polysilicon layer 30 was deposited on the whole surface of the resultant structure, as shown in FIG. 5B. Thereafter, a negative-type resist (OFPR-83 from Tokyo Oka Kogyo Co., Ltd.) and a positive-type resist (OMR-78 from Tokyo Oka Kogyo Co., Ltd.) were applied to the polysilicon layer 30 to successively form negative- and positive-type resist films 24 and 23 each having a thickness of 5,000 Å. Then, ultraviolet rays were applied selectively for exposure to those parts of the positive- and negative-type resist films 23 and 24 which correspond to regions for channel formation. Thereupon, the positive-type resist film 24 underwent a collapse, while the negative-type resist film 24 exhibited a bridging effect.

Figure 5C:
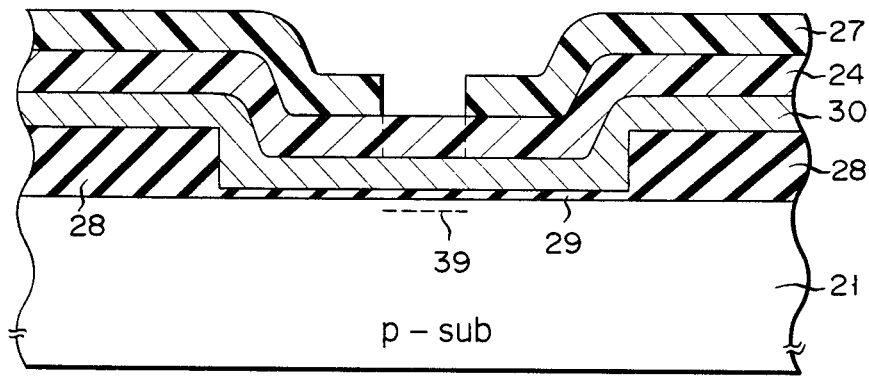

Then, the positive-type resist film 23 was developed by the use of a developing solution for a positive-type resist to form a positive-type resist pattern 27 as a first resist pattern, as shown in FIG. 5C. Thereafter, a p-type impurity, e.g., boron, was ion-implanted in the surface of the substrate 21 with the positive-type resist pattern 27 as a mask, forming a boron ion injection layer 39.

Figure 5D:
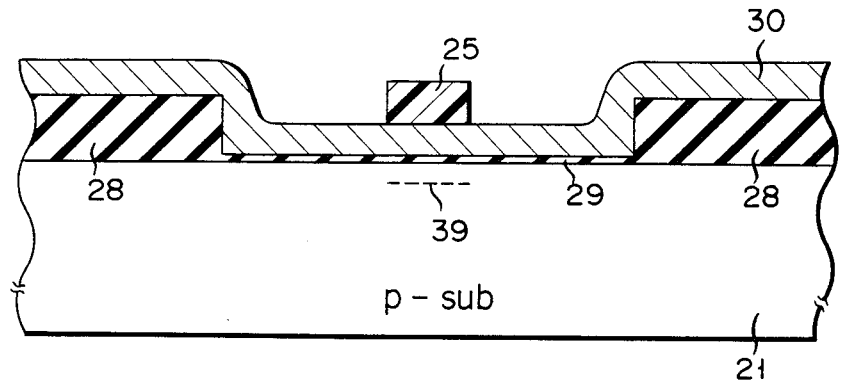
Figure 5E:
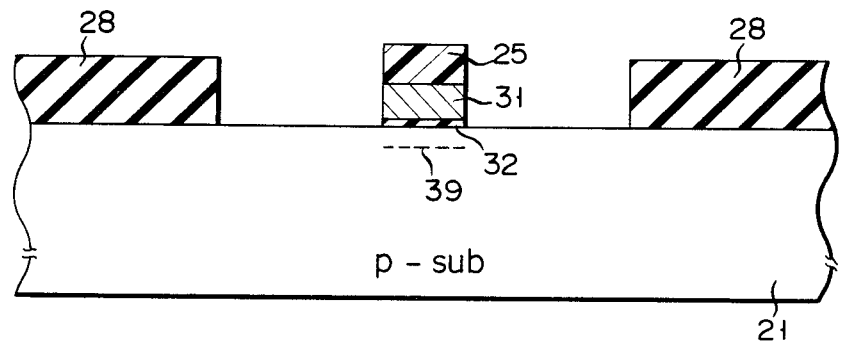

Subsequently, the positive-type resist pattern 27 was peeled off, and the negative-type resist film 24 was thereafter developed by the use of a developing solution for negative-type resist to form a negative-type resist pattern (second resist pattern) 25 which is opposite to the positive-type resist pattern 27, as shown in FIG. 5D. Then, after the polysilicon layer 30 was selectively etched by using the negative-type resist pattern 25 as a mask to form a gate electrode 31, the thin oxide film 29 was selectively etched by using the negative-type resist pattern 25 as a mask to form a gate oxide film 32, as shown in FIG. 5E. Thereafter, an n-type impurity, e.g., phosphorus, was ion-implanted in the exposed surface of the substrate 21 by using the negative-type resist pattern 25 as a mask.

Figure 5F:
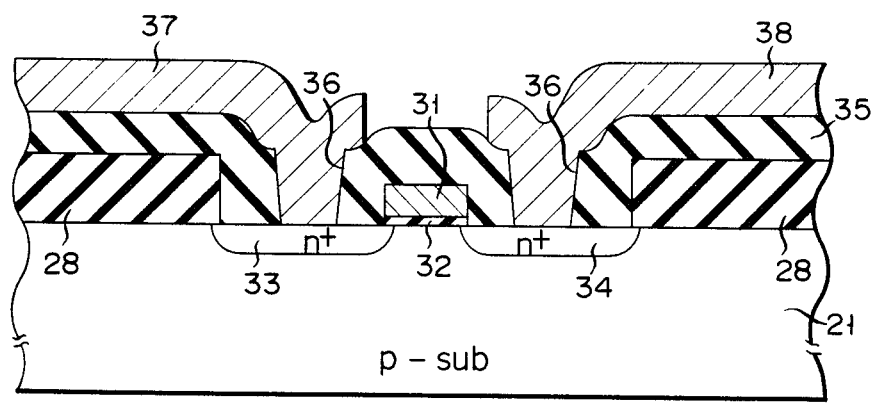

Then, after the negative-type resist pattern 25 was peeled off, n+-type source and drain regions 33 and 34 were formed by heat treatment, and the boron ion injection layer 39 was activated to control the threshold voltage of the channel regions, as shown in FIG. 5F. Subsequently, a $SiO_2$ film 35 was deposited on the whole surface of the resultant structure, and contact holes 36 were formed in those portions of the $SiO_2$ film 35 which correspond to the parts of the source and drain regions 33 and 34. Thereafter, aluminum wirings 37 and 38 connecting the source and drain regions 33 and 34 through the contact holes 36 were formed on the $SiO_2$ film 35. Thus, an MOS transistor was completed.

According to the method of Example 2, the positive-type resist pattern 27 and the negative-type resist pattern 25 opposite to the positive-type resist pattern 27 for the formation of the boron injection layer and the source and drain regions can be formed by one exposure and two developing treatments of the negative-and positive-type resist films 24 and 23 that are successively laid over the polysilicon layer 30 on the silicon substrate 21. Thus, the n+-type source and drain regions 33 and 34 and the channel regions with controlled threshold voltage may be formed in self-alignment. Accordingly, the resistances of the source and drain regions 33 and 34 can be prevented from increasing due to the overlapping of the boron ion injection layer 39 and the source and drain regions 33 and 34 for the threshold voltage control. Thus, an MOS transistor with satisfactory element characteristics may be obtained.

Since the negative-type resist pattern 27 can be used as an etching mask for the gate electrode 31, the gate electrode 31 and the source and drain regions 33 and 34 may be formed in self-alignment.

EXAMPLE 3

Example 3 is applied to the manufacture of a complementary metal oxide semiconductor (CMOS) transistor.

Figure 6A:
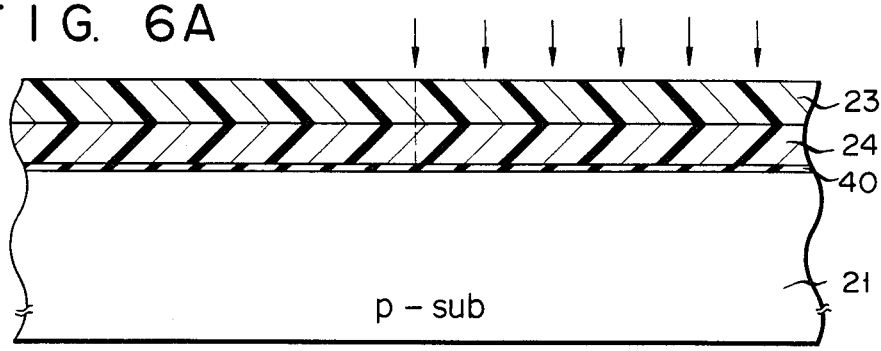
FIGS. 6A to 6H are sectional views illustrating processes for manufacturing a CMOS transistor according to Example 3 of the invention.

First, a p-type silicon substrate 21 was heat-oxidized to form a thin oxide film 40 on the substrate 21, and a negative-type resist (OFPR-83 from Tokyo Oka Kogyo Co., Ltd.) and a positive-type resist (OMR-78 from Tokyo Oka Kogyo Co., Ltd.) were then applied to oxide film 40 to successively form negative- and positive-type resist films 24 and 23 each having a thickness of 5,000 Å, as shown in FIG. 6A. Then, ultraviolet rays were applied selectively for exposure to those parts of the positive- and negative-type resist films 23 and 24 which correspond to a region for p-well region formation. Thereupon, the positive-type resist film 23 underwent a collapse, while the negative-type resist film 24 exhibited a bridging effect.

Figure 6B:
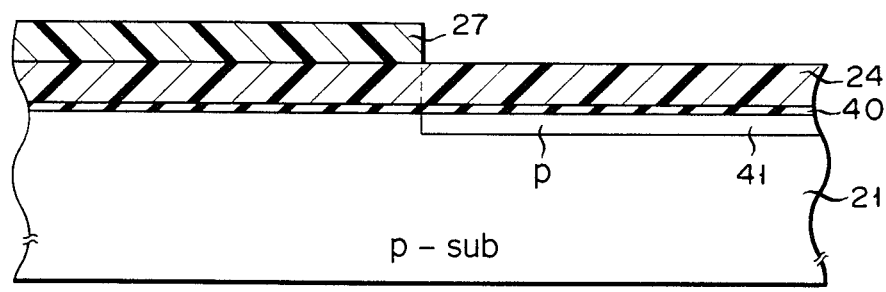

Then, the positive-type resist film 23 was developed by the use of a developing solution for positive-type resist to form a positive-type resist pattern 27 as a first resist pattern, as shown in FIG. 6B. Thereafter, a p-type impurity, e.g., boron, was ion-implanted in the surface of the substrate 21 with the positive-type resist pattern 27 as a mask, forming a p-type impurity layer 41.

Figure 6C:
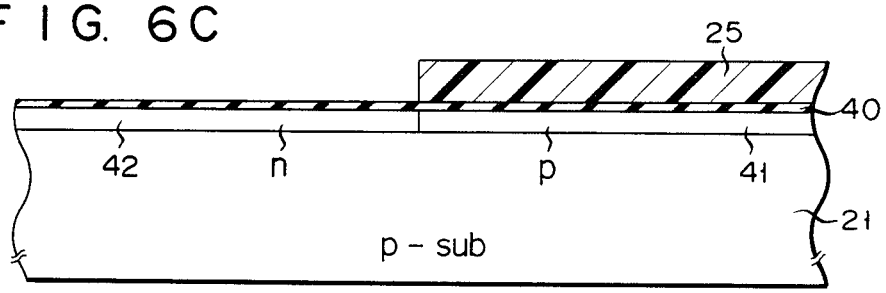
Figure 6D:
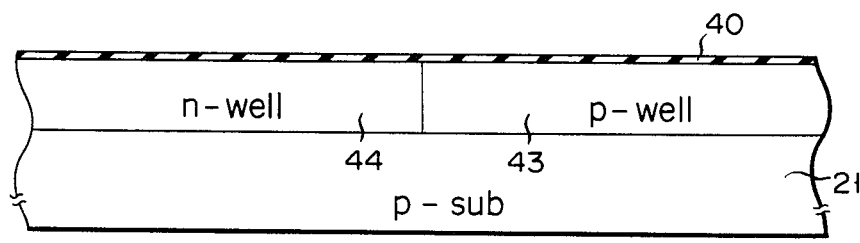

Subsequently, the positive-type resist pattern 27 was peeled off, and the negative-type resist film 24 was thereafter developed by the use of a developing solution for negative-type resist to form a negative-type resist pattern (second resist pattern) 25 which is opposite to the positive-type resist pattern 27, as shown in FIG. 6C. Then, an n-type impurity, e.g., phosphorus, was ion-implanted in the substrate 21 by using the negative-type resist pattern 25 as a mask to form an n-type impurity layer 42. Then, after the negative-type resist pattern 25 was peeled off, the p- and n-type impurity layers 41 and 42 were activated by heat treatment in a nitrogen atmosphere at 1,000° C. for an hour, forming p- and n-well regions (p- and n-type tubs) 43 and 44, respectively, as shown in FIG. 6D.

Figure 6E:
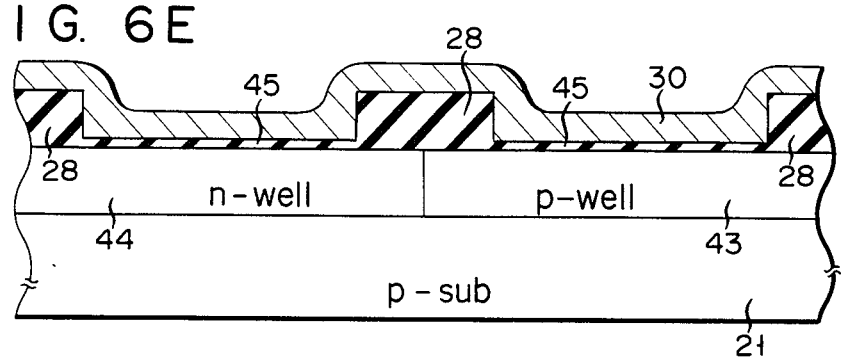

Then, the thin oxide film 40 was removed, and a thick oxide film was formed again. Thereafter, the thick oxide film was patterned to form a field oxide film 28, as shown in FIG. 6E. Subsequently, the structure was heat-oxidized to form an oxide film 45 of 800-Å thickness on the exposed surfaces of the p-and n-well regions 43 and 44, and a polysilicon layer 30 was then deposited on the whole surface of the resultant structure.

Figure 6F:
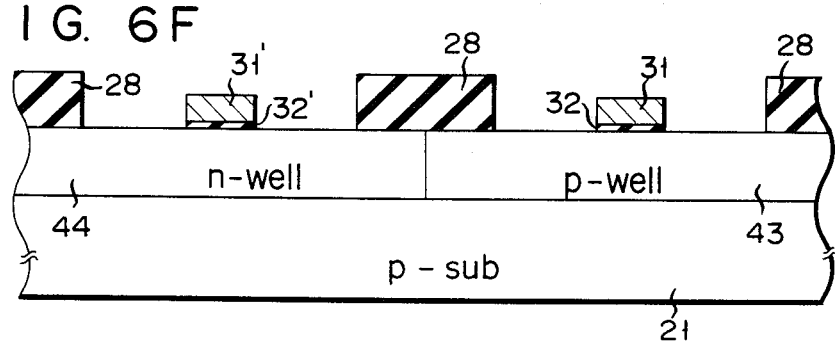
Figure 6G:
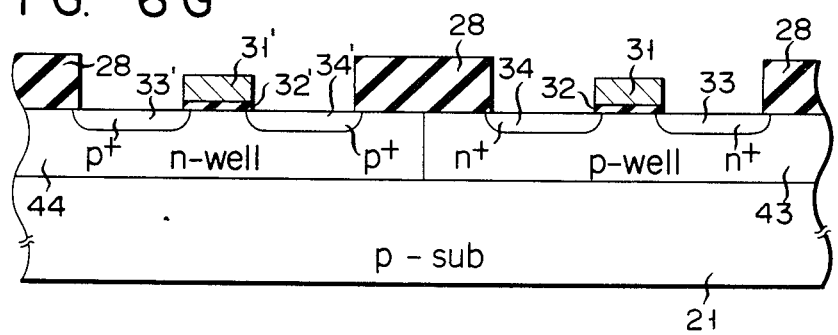

Then, after the polysilicon layer 30 was patterned to form gate electrodes 31 and 31' on those portions of the oxide film 45 on the p- and n-well regions 43 and 44, respectively, the oxide film 45 was selectively etched by using the gate electrodes 31 and 31' as masks to form gate oxide films 32 and 32', as shown in FIG. 6F. Subsequently, after a resist pattern (not shown) covering the n-well region 44 was formed by the PEP, an n-type impurity, e.g., phosphorus, was ion-implanted in the p-well region 43 by using the resist pattern, the gate electrode 31, and the field oxide film 28 as masks. Thereafter, the resist pattern was peeled off, another resist pattern (not shown) covering the p-well region 43 was formed by the PEP, and a p-type impurity, e.g., boron, was ion-implanted in the n-type region 44 by using the resist pattern, the gate electrode 31', and the field oxide film 28 as masks. Subsequently, after the resist pattern was peeled off, n+-type source and drain regions 33 and 34 were formed in the p-well region 43 by heat treatment, while p+-type source and drain regions 33' and 34' were formed in the n-well region 44 in the same manner.

Figure 6H:
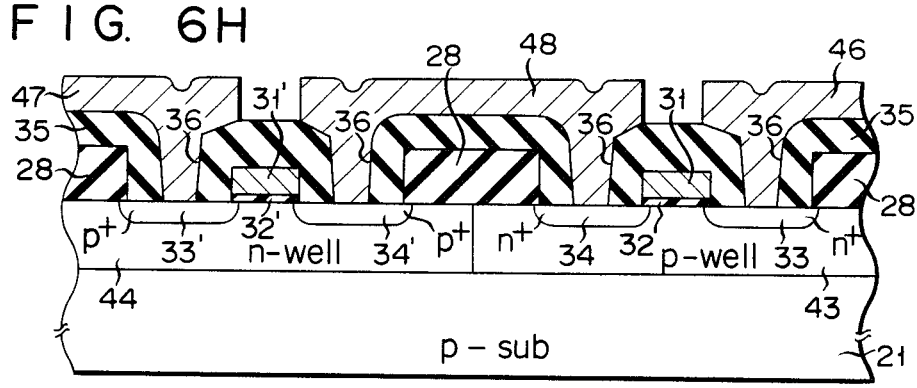

Then, a $SiO_2$ film 35 was deposited on the whole surface of the resultant structure, those portions of the $SiO_2$ film 35 which correspond to parts of the individual source and drain regions 33, 33', 34 and 34' were selectively etched to form contact holes 36 therein, as shown in FIG. 6H. After that, an aluminum wiring 46 connecting with the source region 33 through the contact hole 36, an aluminum wiring 47 connecting with the source region 33' through the contact hole 36, and an aluminum wiring 48 connecting with the drain regions 34 and 34' through the contact holes 36 were formed on the SiO$_2$ film 35. Thus, a CMOS transistor was completed.

According to the method of Example 3, the positive-type resist pattern 27 and the negative-type resist pattern 25 opposite to the positive-type resist pattern 27 for the formation of the p- and n-type impurity regions can be formed by one exposure and two developing treatments of the negative- and positive-type resist films 24 and 23 that are successively laid over the thin oxide film 40 on the silicon substrate 21. Thus, the p- and n-well regions (p-and n-type tubs) 43 and 44 may be formed in self-alignment in the surface of the p-type silicon substrate 21 by heat treatment after the p- and n-type impurity regions 41 and 42 are formed. Accordingly, deterioration of element characteristics attributed to overlapping of the p- and n-well regions 43 and 44 can be avoided, and a fine CMOS transistor may be manufactured without considering the misalignment attributed to the two PEP's.

In Example 1, the positive- and negative-type resist films are deposited on the substrate in the order named. In Examples 2 and 3, on the other hand, the films are deposited in the order of the negative- and positive-type resist films. The same effect may be obtained if the arrangement order of the films is reversed.

In Examples 1 to 3, the two resist films are directly in contact with each other. Alternatively, however, a light-permeable film, e.g., a plasma CVD-SiO$_2$ film, may be interposed between the resist films. With this arrangement, radiation may fully be applied to the lower resist film at exposure, and the light-permeable film can prevent the lower resist film from dissolving while the upper resist film is being developed. Thus, the first and second resist patterns may be formed with high accuracy.

In Examples 1 to 3, the positive- and negative-type resist films used are sensitive to ultraviolet rays. Alternatively, however, any other suitable resist films may be used which are sensitive to other radiation, such as deep ultraviolet rays, X-rays, electron beams, ion beams, etc.

Although the p-type silicon substrate is used as the semiconductor substrate in any of Examples 1 to 3, it may be replaced with an n-type silicon substrate or a silicon-on-sapphire (SOS) substrate.

According to the present invention, as described above, there may be provided a method for manufacturing a semiconductor device with satisfactory element characteristics and a high degree of integration in which the first and second resist patterns in an inverse relation are formed in self-alignment and used as masks.

What is claimed is:

1. A method for manufacturing a semiconductor device, comprising:
    a step of forming a positive-type resist film and a negative-type resist film on a semiconductor substrate to form upper and lower resist films;
    a step of exposing predetermined regions of the positive-type and negative-type resist films to radiation;
    a step of developing the upper resist film, thereby forming a first resist pattern, and ion-implanting an impurity into the semiconductor substrate by using the first resist pattern as a mask;
    a step of developing the lower resist film after peeling off the first resist pattern, thereby forming a second resist pattern; and
    a step of treating the semiconductor substrate, using the second resist pattern as a mask.

2. A method for manufacturing a semiconductor device, comprising:
    a step of forming a first insulation film on a semiconductor substrate;
    a step of forming a positive-type resist film and a negative-type resist film on the first insulation film to form upper and lower resist films;
    a step of exposing predetermined regions of the positive-type and negative-type resist films to radiation;
    a step of developing the upper resist film, thereby forming a first resist pattern, and ion-implanting an impurity of the same conductivity type as that of the semiconductor substrate into the semiconductor substrate, through the lower resist film and the first insulation film, using the first resist pattern as a mask;
    a step of developing the lower resist film after peeling off the first resist pattern, thereby forming a second resist pattern opposite to the first resist pattern;
    a step of selectively etching the first insulation film by using the second resist pattern as a mask, thereby forming a field insulation film; and
    a step of heating the semiconductor substrate, thereby activating the impurity, so as to form in the substrate a field inversion preventing layer.

3. The method according to claim 2, wherein the first insulation film is 3000-Å or more thick.

4. The method according to claim 2, wherein the first insulation film is a silicon oxide film.

5. The method according to claim 2, wherein the semiconductor substrate is of p-type and the impurity ion-implanted in the substrate is boron.

6. A method for manufacturing a semiconductor device, comprising:
    a step of forming an insulation film on a semiconductor substrate;
    a step of depositing a conductive material layer on the insulation film;
    a step of forming a positive-type resist film and a negative-type resist film on the conductive material layer to form upper and lower resist films;
    a step of exposing predetermined regions of positive-type and negative-type resist films to radiation;
    a step of developing the upper resist film, thereby forming a first resist pattern, and ion-implanting a first impurity into the semiconductor substrate though the lower resist film, conductive material layer and insulation film, using the first resist pattern as a mask;
    a step of developing the lower resist film after peeling off the first resist pattern, thereby forming a second resist pattern opposite to the first resist pattern;
    a step of selectively etching the conductive material layer by using the second resist pattern as a mask, thereby forming a gate electrode, and ion-implanting into the semiconductor substrate a second impurity whose conductivity type is opposite to that of the substrate, by using the second resist pattern as a mask; and
    a step of heating the semiconductor substrate, thereby activating the first impurity and the second impurity, so as to form in the semiconductor substrate source and drain regions of the conductivity type opposite to that of the substrate and to control the threshold voltage of a channel region formed between these source and drain regions.

7. The method according to claim 6, wherein the insulation film is 1000-Å or less thick.

8. The method according to claim 6, wherein the insulation film is a silicon oxide film.

9. The method according to claim 6, wherein the conductive material layer is an impurity-doped polycrystalline silicon layer.

10. The method according to claim 6, wherein the conductive material layer is a refractory metal silicide layer.

11. The method according to claim 6, wherein the conductive material layer is made of a film of impurity-doped polycrystalline silicon and a film of refractory metal silicide.

12. The method according to claim 6, wherein said substrate is of p-type, the first impurity is boron and said second impurity is arsenic.

13. A method for manufacturing a semiconductor device, comprising:

a step of forming an insulation film on a semiconductor substrate;

a step of forming a positive-type resist film and a negative-type resist film on the insulation film to form upper and lower resist films;

a step of exposing predetermined regions of the positive-type and negative-type resist films to radiation;

a step of developing the upper resist film, thereby forming a first resist pattern, and ion-implanting a first impurity of one conductivity type into the semiconductor substrate through the lower resist film and insulation film, by using the first resist pattern as a mask;

a step of developing the lower resist film after peeling off the first resist film, thereby forming a second resist pattern opposite to the first resist pattern;

a step of ion-implanting into the semiconductor substrate a second impurity of the conductivity type opposite to that of the first impurity, using the second resist pattern as a mask; and a step of heating the semiconductor substrate, thereby activating the first and second impurities ion-implanted in the semiconductor substrate, so as to form two tub regions of the opposite conductivity types in the surface region of the semiconductor substrate.

14. The method according to claim 13, wherein the insulation film is 1000-Å or less thick.

15. The method according to claim 13, wherein the insulation film is a silicon oxide film.

* * * * *